(12) United States Patent
Heo et al.

(10) Patent No.: US 10,181,497 B2
(45) Date of Patent: Jan. 15, 2019

(54) OPTOELECTRONIC DEVICE, AND IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Sung Heo, Suwon-si (KR); Kyu Sik Kim, Yongin-si (KR); Nam Jeong Kim, Gwangju-si (KR); Seong Heon Kim, Seongnam-si (KR); Yongsung Kim, Suwon-si (KR); Eunae Cho, Seoul (KR); Takkyun Ro, Hwaseong-si (KR); Dongjin Yun, Pohang-si (KR); Yongsu Kim, Seongnam-si (KR); Wenxu Xianyu, Suwon-si (KR); Yong-Young Park, Hwaseong-si (KR); Kyung Bae Park, Hwaseong-si (KR)

(73) Assignee: Samsung Electronics, Ltd., Gyeonggi-Do (KR)

( * ) Notice: Subject to any disclaimer, the term of this patent is extended or adjusted under 35 U.S.C. 154(b) by 0 days.

(21) Appl. No.: 15/409,656

(22) Filed: Jan. 19, 2017

(65) Prior Publication Data

US 2017/0207275 A1 Jul. 20, 2017

(30) Foreign Application Priority Data

Jan. 19, 2016 (KR) ........................ 10-2016-0006680

(51) Int. Cl.
*H01L 27/30* (2006.01)
*H01L 51/44* (2006.01)
(Continued)

(52) U.S. Cl.
CPC ...... *H01L 27/307* (2013.01); *H01L 27/14621* (2013.01); *H01L 27/301* (2013.01);
(Continued)

(58) Field of Classification Search
None
See application file for complete search history.

(56) References Cited

U.S. PATENT DOCUMENTS

| 2009/0188547 | A1 | 7/2009 | Hayashi et al. |
| 2010/0237338 | A1 | 9/2010 | Yamamoto et al. |
| 2014/0231781 | A1* | 8/2014 | Imai ............... H01L 51/448 257/40 |

FOREIGN PATENT DOCUMENTS

| JP | 60-001873 A | 8/1985 |
| JP | 2002/175887 A | 6/2002 |

(Continued)

OTHER PUBLICATIONS

Extended European Search Report dated Jun. 6, 2017 issued in corresponding European Application No. 17151997.8.
(Continued)

*Primary Examiner* — Michelle Mandala
(74) *Attorney, Agent, or Firm* — Harness, Dickey & Pierce, P.L.C.

(57) ABSTRACT

An optoelectronic device includes a first electrode and a second electrode facing each other a photoelectric conversion layer between the first electrode and the second electrode and a buffer layer between the photoelectric conversion layer and the second electrode. The buffer layer includes a nitride. The nitride includes one of silicon nitride ($SiN_x$, $0<x<1$), silicon oxynitride ($SiO_yN_z$, $0<y<0.5$, $0<z<1$), and a combination thereof.

28 Claims, 11 Drawing Sheets

(51) Int. Cl.
- *H01L 51/50* (2006.01)
- *H01L 51/52* (2006.01)
- *H01L 27/146* (2006.01)
- *H01L 51/56* (2006.01)
- *H01L 51/42* (2006.01)

(52) U.S. Cl.
CPC ............ *H01L 51/42* (2013.01); *H01L 51/441* (2013.01); *H01L 51/5092* (2013.01); *H01L 51/5096* (2013.01); *H01L 51/5203* (2013.01); *H01L 51/56* (2013.01); *H01L 51/5088* (2013.01); *H01L 2251/552* (2013.01)

(56) References Cited

FOREIGN PATENT DOCUMENTS

| | | |
|---|---|---|
| KR | 2012/0043659 A | 5/2012 |
| KR | 2013/0075326 A | 7/2013 |
| WO | WO-2009/118848 A1 | 10/2009 |

OTHER PUBLICATIONS

Chiu-Sheng Ho et al. "Efficiency improvements in single-heterojunction organic photovoltaic cells by insertion of wide-bandgap electron-blocking layers." Solid-State Electronics. Elsevier Journal. (2012). p. 101-103.

Shao-Sian Li et al. "Solution-Processable Graphene Oxide as an Efficient Hole Transport Layer in Polymer Solar Cells". American Chemical Society. ACS Nano. (2010) p. 3169-3174.

Jucheol Park et al. "Bandgap measurement of thin dielectric films using monochromated STEM EELS". Ultramicroscopy. Elsevier Journal. (2009). p. 1183-1188.

Hei Wong et al. "Defects in silicon oxynitride gate dielectric films". Microelectronics Reliability 42. Pergamon. (2002). p. 597-605.

* cited by examiner

OPTOELECTRONIC DEVICE, AND IMAGE SENSOR AND ELECTRONIC DEVICE INCLUDING THE SAME

CROSS REFERENCE TO RELATED APPLICATION

This application claims priority under 35 U.S.C. § 119 to Korean Patent Application No. 10-2016-0006680 filed in the Korean Intellectual Property Office on Jan. 19, 2016, the entire contents of which are incorporated herein by reference.

BACKGROUND

1. Field

Example embodiments relate to an optoelectronic device, and an image sensor and/or an electronic device including the same.

2. Description of Related Art

An optoelectronic device is a device in which a charge exchange occurs between an electrode and a photoelectric conversion layer by using holes or electrons.

An optoelectronic device may be classified based on its driving principles. A first type of optoelectronic device may be driven as follows: excitons are generated in a photoelectric conversion layer by photons from an external light source; the excitons are separated into electrons and holes; and the electrons and holes are transferred to different electrodes as a current source (voltage source). A second type of optoelectronic device may be driven as follows: a voltage or a current is applied to at least two electrodes to inject holes and/or electrons into a photoelectric conversion layer positioned at an interface of the electrodes, and the device is driven by the injected electrons and holes.

The optoelectronic device may have a structure in which a photoelectric conversion layer including a functional inorganic or organic material is between an anode and a cathode. The optoelectronic device may include a buffer layer (e.g. a hole injection layer (HIL), a hole transport layer (HTL), an electron transport layer (ETL), and an electron injection layer (EIL)) between an anode and a photoelectric conversion layer or a cathode and a photoelectric conversion layer, in order to improve efficiency and stability.

An organic optoelectronic device including a photoelectric conversion layer including an organic material may have relatively low external quantum efficiency in a visible light region and a relatively high dark current due to internal impurities in the organic material compared with an inorganic optoelectronic device including an inorganic oxide. The high dark current may increase the leakage current of the organic optoelectronic device. The increased leakage current may deteriorate the sensitivity of the organic optoelectronic device as well as accuracy of the external quantum efficiency converted from a photocurrent during the photoreaction and increases noise signals.

Accordingly, development of an optoelectronic device capable of decreasing the dark current is needed.

SUMMARY

Some example embodiments provide an optoelectronic device having excellent sensitivity and performance by reducing dark current.

Some example embodiments also provide an image sensor having excellent sensitivity and performance due to the optoelectronic device.

Some example embodiments also provide an electronic device including the image sensor.

According to some example embodiments, an optoelectronic device includes a first electrode and a second electrode facing each other a photoelectric conversion layer between the first electrode and the second electrode, and a buffer layer between the photoelectric conversion layer and the second electrode. The buffer layer includes a nitride. The nitride includes one of silicon nitride ($SiN_x$, $0<x<1$), silicon oxynitride ($SiO_yN_z$, $0<y<0.5$, $0<z<1$), and a combination thereof.

In some example embodiments, the nitride may further include phosphorus.

In some example embodiments, the phosphorus may be included in an amount of about 10 at % based on 100 at % of the nitride.

In some example embodiments, the buffer layer may be an electron blocking layer contacting the second electrode.

In some example embodiments, the buffer layer may include a nitride including one of $SiN_x$ ($0.2 \leq x \leq 0.7$), $SiO_yN_z$ ($0.05 \leq y \leq 0.35$, $0.2 \leq z \leq 0.7$), and a combination thereof.

In some example embodiments, the buffer layer may have an energy bandgap of about −3.8 eV to about −1.5 eV.

In some example embodiments, when the second electrode may include a metal oxide. The nitride may include the silicon nitride. the silicon nitride may have a valence band level of about −5.0 eV to about −4.5 eV and a conduction band level of about −3.5 eV to about −2.0 eV.

In some example embodiments, the second electrode may include a metal oxide and the nitride may include the silicon oxynitride. The silicon oxynitride may have a valence band level of about −5.8 eV to about −4.5 eV and a conduction band level of about −3.5 eV to about −1.5 eV.

In some example embodiments, a valence band (VB) level of the buffer layer may be higher that a HOMO level of the photoelectric conversion layer and a conduction band (CB) level of the buffer layer may be higher than a LUMO level of the photoelectric conversion layer.

In some example embodiments, a difference between a valence band (VB) level of the buffer layer and a HOMO level of the photoelectric conversion layer may be greater than about 0 eV and less than or equal to about 0.5 eV and a difference between a conduction band (CB) level of the buffer layer and a LUMO level of the photoelectric conversion layer may be greater than or equal to about 1.1 eV and less than or equal to about 4 eV.

In some example embodiments, the buffer layer may have a thickness of about 1 nm to about 30 nm.

In some example embodiments, the buffer layer may be a first buffer layer, and the optoelectronic device may further include a second buffer layer between the first electrode and the photoelectric conversion layer. The second buffer layer may be a hole blocking layer. The second buffer layer may include an inorganic oxide. The inorganic oxide of the second buffer layer may include one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof.

In some example embodiments, the first electrode and the second electrode may each independently include one of a metal, a metal oxide, and a combination thereof.

In some example embodiments, the buffer layer may include a first electron blocking layer including silicon nitride ($SiN_x$, $0<x<1$) and a second electron blocking layer including one of silicon oxynitride ($SiO_yN_z$, $0<y<0.5$, $0<z<1$), P-doped silicon oxynitride ($SiO_yN_z$:P, $0<y<0.5$, $0<z<1$) or a combination thereof.

In some example embodiments, the optoelectronic device may be a light-emitting device, a photodetector, a memory device, or a solar cell.

According to some example embodiments, an image sensor including the optoelectronic device is provided. The image sensor may include a substrate integrated with the optoelectronic device.

In some example embodiments, the image sensor includes a plurality of first photo-sensing devices and a plurality of second photo-sensing devices integrated with the substrate. The substrate may be a semiconductor substrate. The plurality of first photo-sensing devices may be configured to sense light in a blue wavelength region. The plurality of second photo-sensing devices may be configured to sense light in a red wavelength region. The optoelectronic device may be an organic optoelectronic device on the semiconductor substrate. The optoelectronic device may be configured to selectively absorb light in a green wavelength region.

In some example embodiments, the image sensor may further include a color filter layer on the semiconductor substrate. The color filter layer may include a blue filter configured to absorb light in the blue wavelength region and a red filter configured to absorb light in the light in a red wavelength region, between the semiconductor substrate and the optoelectronic device.

In some example embodiments, the plurality of first photo-sensing devices and the plurality of second photo-sensing devices may be stacked in a vertical direction on the semiconductor substrate.

In some example embodiments, the image sensor may further include a green photoelectric device, a blue photoelectric device, and a red photoelectric device stacked on each other on the semiconductor substrate. The green photoelectric device may be configured to selectively absorb light in the green wavelength region. The blue photoelectric device may be configured to selectively absorb light in the blue wavelength region, and the red photoelectric device may be configured to selectively absorb light in the red wavelength region.

According to some example embodiments, an electronic device may include the above-described image sensor. The substrate may be a semiconductor substrate.

According to some example embodiments, an optoelectronic device includes a first electrode, a second electrode on the first electrode, a photoelectric conversion layer between the first electrode and the second electrode, an a buffer layer between the photoelectric conversion layer and one of the first electrode and the second electrode. At least one of the first and second electrodes may be a light-transmitting electrode. The buffer layer may include a nitride layer including one of silicon nitride ($SiN_x$, $0<x<1$), silicon oxynitride ($SiO_yN_z$, $0<y<0.5$, $0<z<1$), and a combination thereof.

In some example embodiments, the optoelectronic device may further include a second buffer layer between the first electrode and the photoelectric conversion layer. The buffer layer between the photoelectric conversion layer and one of the first electrode and the second electrode may be a first buffer layer between the photoelectric conversion layer and the second electrode. The second buffer layer may include an inorganic oxide layer. The inorganic oxide layer may include one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof.

In some example embodiments, the optoelectronic device may further include at least one of a hole injection layer and an electron injection layer. The hole injection layer may be between the photoelectric conversion layer and a first one of the first electrode and the second electrode. The electron injection layer may be between the photoelectric conversion layer and a second one of the first electrode and the second electrode that is different than the first one of the first electrode and the second electrode.

In some example embodiments, the buffer layer may include a first electron blocking layer including silicon nitride ($SiN_x$, $0<x<1$) and a second electron blocking layer. The second electron blocking layer may include one of silicon oxynitride ($SiO_yN_z$, $0<y<0.5$, $0<z<1$), P-doped silicon oxynitride ($SiO_yN_z$:P, $0<y<0.5$, $0<z<1$), and a combination thereof. The nitride layer may be the first electron blocking layer.

In some example embodiments, the nitride layer may further include phosphorus.

DETAILED DESCRIPTION

Figure 1A:
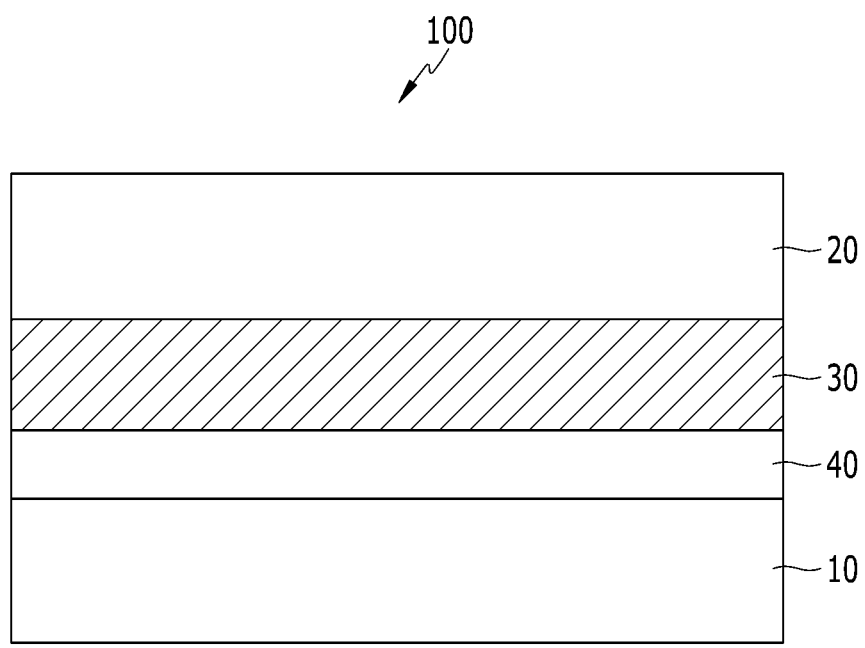
FIGS. 1A to 1C are cross-sectional views showing optoelectronic devices according to some example embodiments.

Some example embodiments will hereinafter be described in detail, and may be easily performed by those who have common knowledge in the related art. However, this disclosure may be embodied in many different forms and is not to be construed as limited to the example embodiments set forth herein. In the drawings, the thickness of layers, films, panels, regions, etc., are exaggerated for clarity. Like reference numerals designate like elements throughout the specification.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element or layer is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

In the drawings, parts having no relationship with the description are omitted for clarity of the embodiments, and the same or similar constituent elements are indicated by the same reference numerals throughout the disclosure.

As used herein, when a definition is not otherwise provided, the term "substituted" may refer to replacement of hydrogen of a compound or a functional group by a substituent including one of a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C1 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof.

As used herein, when a definition is not otherwise provided, the prefix "hetero" may refer to one including 1 to 3 heteroatoms including one of N, O, S, P, and Si.

As used herein, "an alkyl group" may be, for example a methyl group, an ethyl group, a propyl group, an isopropyl group, a n-butyl group, an isobutyl group, a t-butyl group, a pentyl group, a hexyl group, and the like.

As used herein, "a cycloalkyl group" may be a cyclopropyl group, a cyclobutyl group, a cyclopentyl group, a cyclohexyl group, and the like.

As used herein, "an aryl group" refers to a substituent including all element of the cycle having p-orbitals which form conjugation, and may be a monocyclic, polycyclic or fused ring polycyclic (i.e., rings sharing adjacent pairs of carbon atoms) functional group.

As used herein, when a definition is not otherwise provided, "a cyano-containing group" refers to a monovalent functional group where at least one hydrogen of a C1 to C30 alkyl group, a C2 to C30 alkenyl group, or a C2 to C30 alkynyl group is replaced by a cyano group. In addition, the cyano-containing group may include a divalent functional group such as a dicyanoalkenyl group represented by $=(CR^x)_pC(CN)_2$ wherein $R^x$ is hydrogen or a C1 to C10 alkyl group and p is an integer ranging from 0 to 10. Examples of the cyano-containing group may be a dicyanomethyl group, a dicyanovinyl group, a cyano ethynyl group, and the like.

As used herein, when a definition is not otherwise provided, "a combination" refers to a mixture or a stack of two or more materials.

Hereinafter, an optoelectronic device according to some example embodiments is described referring to drawings.

Figure 1B:
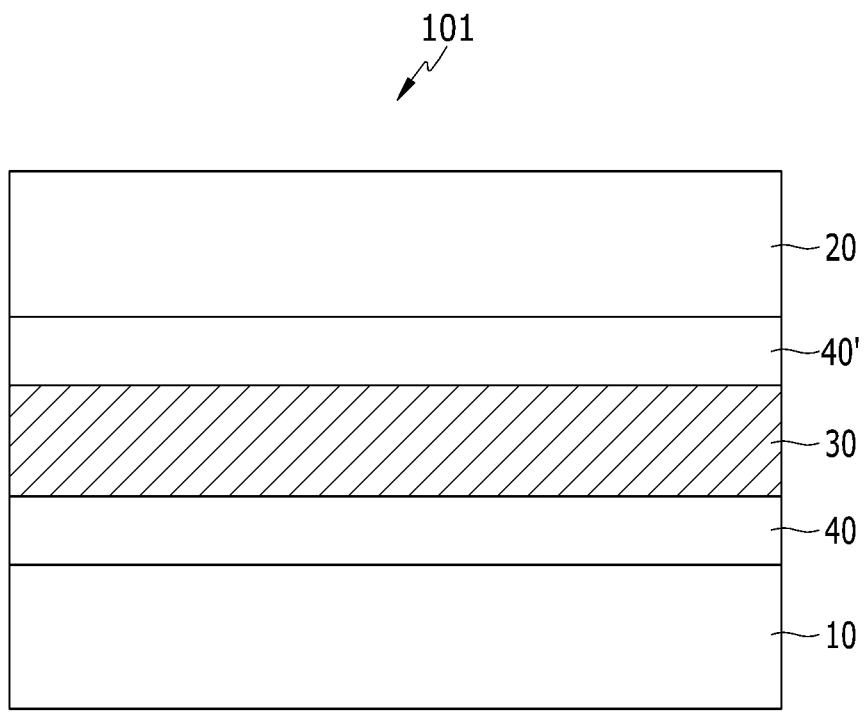
Figure 1C:
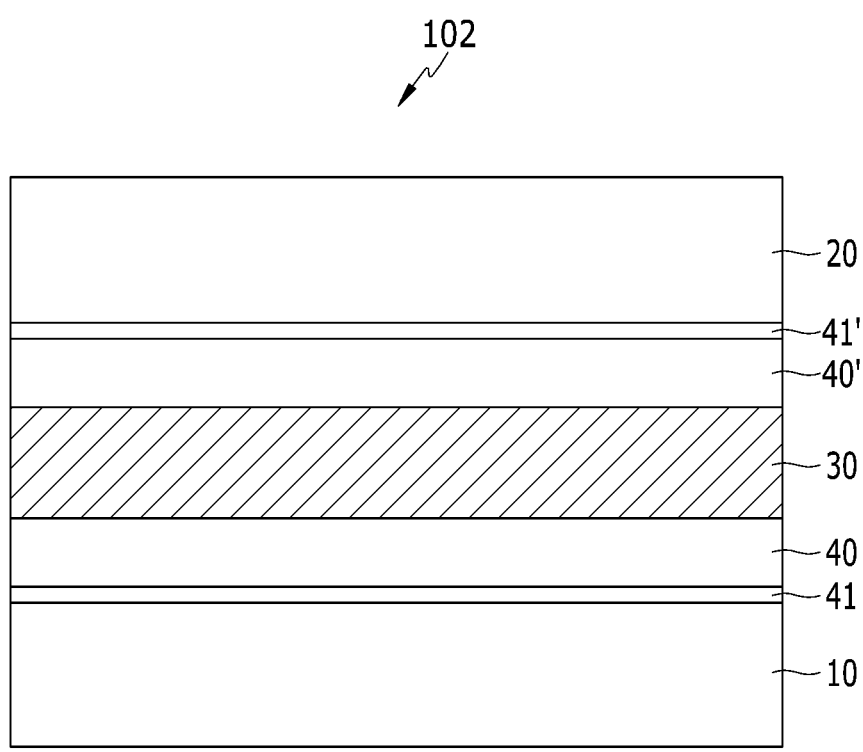

FIGS. 1A to 1C are cross-sectionals view showing optoelectronic devices according to some example embodiments.

Referring to FIG. 1A, an optoelectronic device 100 according to some example embodiments includes an anode 10 and a cathode 20 facing each other, a photoelectric conversion layer 30 between the anode 10 and the cathode 20, and a buffer layer 40 between the anode 10 and the photoelectric conversion layer 30, wherein the buffer layer 40 includes a nitride. The nitride includes (or is composed) one of silicon nitride ($SiN_x$, $0<x<1$), silicon oxynitride ($SiO_yN_z$, $0<y<0.5$, $0<z<1$), and a combination thereof.

A substrate (not shown) may be disposed on a surface of the anode 10 and a surface of the cathode 20. The substrate may be, for example, made of an inorganic material such as glass, quartz, or a silicon wafer, or an organic material such as polycarbonate, polymethylmethacrylate, polyethyleneterephthalate, polybutyleneterephthalate, polyethylenenaphthalate, polyamide, polyethersulfone, polycarbonate, polyvinyl alcohol, polyacrylate, polyimide, polynorbornene, or a combination thereof. When the organic material is used, it may be applied to a flexible optoelectronic device.

At least one of the anode 10 and the cathode 20 may be a light-transmitting electrode. For example the anode 10 may be a non-light-transmitting electrode and the cathode 20 may be a light-transmitting electrode. The light-transmitting electrode is transparent to at least 85% or 95% of light in the visible spectrum range.

In example embodiments, the anode 10 may include a metal, a metal oxide, or a combination thereof and the cathode 20 may include a metal (and/or metal alloy), a metal oxide, or a combination thereof. If the anode 10 and/or cathode 20 includes a metal (and/or metal alloy), a thickness of the metal (and/or metal alloy) may thin (e.g., greater than 1 nm and less than about 25 nm) to form a light-transmitting electrode. However, example embodiments are not limited thereto.

The metal of the anode 10 may include at least one selected from silver (Ag), aluminum (Al), copper (Cu), gold (Au), and an alloy thereof and the metal oxide of the anode 10 may include at least one selected from an indium tin oxide (ITO), an indium zinc oxide (IZO), a zinc oxide (ZnO), a tin oxide (SnO), an aluminum tin oxide (AITO) and a fluorine doped tin oxide (FTO).

The metal of the cathode 20 may include at least one selected from silver (Ag), aluminum (Al), copper (Cu), gold (Au), and an alloy thereof, and the metal oxide of the cathode 20 may include an indium tin oxide (ITO), an indium zinc oxide (IZO), a zinc oxide (ZnO), a tin oxide (SnO), an aluminum tin oxide (AITO), a fluorine doped tin oxide (FTO), a molybdenum oxide, a tungsten oxide, a vanadium oxide, a rhenium oxide, a niobium oxide, a tantalum oxide, a titanium oxide, a nickel oxide, a copper oxide, a cobalt oxide, a manganese oxide, a chromium oxide, an indium oxide, or a combination thereof.

When the optoelectronic device 100 is a light-receiving device, the photoelectric conversion layer 30 includes a p-type semiconductor and n-type semiconductor to form a pn junction, and externally receives light, produces excitons, and separates the excitons into holes and electrons. The p-type semiconductor and the n-type semiconductor may be an organic material, an inorganic material, or a combination thereof.

The photoelectric conversion layer 30 may include an intrinsic layer including both a p-type semiconductor and an n-type semiconductor, and may be formed, for example, using a codeposition method and the like.

The photoelectric conversion layer 30 may further include at least one of a p-type layer and an n-type layer along with the intrinsic layer. The p-type layer includes a p-type semiconductor and the n-type layer includes an n-type semiconductor.

The p-type semiconductor may include, for example, a compound such as an indanone derivative, an indandione derivative, N,N-dimethyl-quinacridone (DMQA), diindenoperylene, dibenzo{[f,f']-4,4',7,7'-tetraphenyl}diindeno[1,2,3-cd:1',2',3'-lm]perylene, but is not limited thereto.

The indanone derivative and the indandione derivative may be represented by Chemical Formula 1.

[Chemical Formula 1]

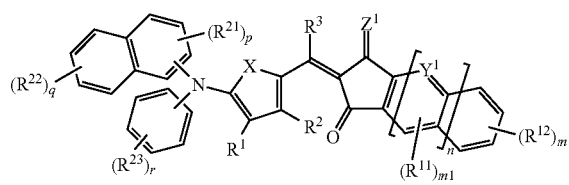

In Chemical Formula 1,

X is selected from S, Se, Te, S(=O), S(=O)$_2$, and SiR$^a$R$^b$ (wherein R$^a$ and R$^b$ are selected from hydrogen and a substituted or unsubstituted C1 to C10 alkyl group), Z$^1$ is selected from 0 and CR$^c$R$^d$ (wherein R$^c$ and R$^d$ are independently hydrogen, a substituted or unsubstituted C1 to C10 alkyl group, a cyano group, or a cyano-containing group, and at least one of R$^c$ and R$^d$ is a cyano group or a cyano-containing group), Y$^1$ is selected from N and CR$^e$ (wherein R$^e$ is hydrogen or a substituted or unsubstituted C1 to C10 alkyl group), R$^1$ to R$^3$, R$^{11}$, and R$^{12}$ are independently selected from hydrogen, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, and a combination thereof, m1 is 0 or 1, m2 is an integer ranging from 0 to 4, n is 0 or 1, R$^{21}$ to R$^{23}$ are independently selected from hydrogen, a halogen, a cyano group (—CN), a cyano-containing group, a substituted or unsubstituted C1 to C6 alkyl group, a substituted or unsubstituted C1 to C6 alkoxy group, and a combination thereof, p is an integer ranging from 0 to 3, q is an integer ranging from 0 to 4, and r is an integer ranging from 0 to 5.

The n-type semiconductor may include, for example, dicyanovinyl-terthiophene (DCV3T), subphthalocyane (SubPc), fullerene, a fullerene derivative, perylene diimide, and the like, but is not limited thereto.

The fullerene may include C50, C60, C70, C76, C78, C80, C82, C84, C90, C96, C240, C540, a mixture thereof, a fullerene nanotube, and the like. The fullerene derivative may refer to compounds of these fullerenes having a substituent attached thereto. The fullerene derivative may include a substituent such as an alkyl group, an aryl group, or a heterocyclic group. Examples of the aryl groups and heterocyclic groups may be a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizidine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, an xanthene ring, a phenoxathin ring, a phenothiazine ring, or a phenazine ring.

On the other hand, when the optoelectronic device 100 is a light-emitting device, the photoelectric conversion layer 30 may include materials that are configured to recombine holes injected from the anode 10 and electrons injected from the cathode 20 to form excitons, receive energy from the excitons, and thus emit light of a particular wavelength. These materials may be an organic compound, an inorganic compound without a particular limit. For example, a material emitting green-based light may be poly(p-phenylenevinylene) (p-PPV) and the like, a material emitting red-based light may be MEH-PPV (poly[2-methoxy-5-(2'-ethyl-hexyloxy)-1,4-phenylene vinylene] mainly emitting orange light and the like.

The buffer layer 40 may be present between the anode 10 and the photoelectric conversion layer 30, and may include a nitride selected from silicon nitride (SiN$_x$, 0<x<1), silicon oxynitride (SiO$_y$N$_z$, 0<y<0.5, 0<z<1), and a combination thereof. In some example embodiments, the buffer layer 40 includes a nitride selected from SiN$_x$ (0.2≤x≤0.7), silicon oxynitride (SiO$_y$N$_z$, 0.05≤y≤0.35, 0.2≤z≤0.7), and a combination thereof. The materials for the buffer layer 40 may have electron blocking performance and improve a dark current within the stoichiometric ratio ranges (x, y, and z).

The nitride may further include phosphorus. When the nitride further includes phosphorus, the number of a dangling bond, particularly the number of a dangling bond of Si may be reduced and structure defects may be reduced.

The phosphorus may be included in an amount of less than or equal to about 10 at % (i.e., 100 at % of the sum of all atoms in the nitride), for example, about 0.01 at % to about 10 at % based on 100 at % of the nitride. Within the ranges, the number of a dangling bond, particularly the number of a dangling bond of Si may be reduced, structure defects may be reduced, and bandgaps may be increased.

When the anode 10 includes a metal oxide, for example an indium tin oxide (ITO), an indium zinc oxide (IZO), a zinc oxide (ZnO), a tin oxide (SnO), an aluminum tin oxide (AITO), a fluorine doped tin oxide (FTO), the silicon nitride may have a valence band level of about −5.0 eV to about −4.5 eV and a conduction band level of about −3.5 eV to about −2.0 eV. When the anode 10 includes a metal oxide, for example, an indium tin oxide (ITO), an indium zinc oxide (IZO), a zinc oxide (ZnO), a tin oxide (SnO), an aluminum tin oxide (AITO), a fluorine doped tin oxide (FTO), the silicon oxynitride may have a valence band level of about −5.8 eV to about −4.5 eV and a conduction band level of about −3.5 eV to about −1.5 eV.

The buffer layer 40 may have an energy bandgap of about −3.8 eV to about −1.5 eV, for example about −3.7 eV to about −1.9 eV. Within the ranges, electrons are effectively prevented from being transferred to the anode 10 and a dark current of the optoelectronic device 100 may be minimized.

The silicon nitride or the silicon oxynitride may have the aforementioned valence and conduction band levels by adjusting x indicating a stoichiometric ratio of the silicon nitride or y and z indicating a stoichiometric ratio of the silicon oxynitride within the range. The silicon nitride and the silicon oxynitride having a stoichiometric ratio within the range have a higher valence band level and a lower conduction band level than general silicon nitride ($Si_3N_4$) or silicon oxynitride ($Si_2ON_2$ or $SiON_3$).

A valence band (VB) level of the buffer layer 40 may be higher that a HOMO level of the photoelectric conversion layer 30 and a conduction band (CB) level of the buffer layer 40 may be higher than a LUMO level of the photoelectric conversion layer 30. For example, a difference between a valence band (VB) level of the buffer layer 40 and a HOMO level of the photoelectric conversion layer 30 may be greater than about 0 eV and less than or equal to about 0.5 eV and a difference between a conduction band (CB) level of the buffer layer 40 and a LUMO level of the photoelectric conversion layer 30 may be greater than or equal to about 1.1 eV and less than or equal to about 4 eV.

Figure 2:
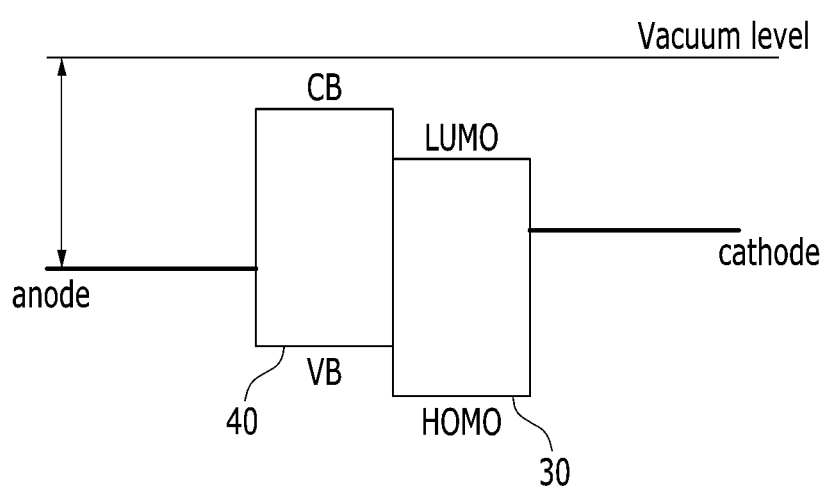
FIG. 2 is a cross-sectional view showing an optoelectronic device according to some example embodiments.

The energy level of the buffer layer 40 is illustrated referring to FIG. 2. FIG. 2 schematically shows valence/conduction band levels of the buffer layer 40 and HOMO/LUMO energy levels of the photoelectric conversion layer 30 of the optoelectronic device. A valence band (VB) level of the buffer layer 40 may be higher that a HOMO level of the photoelectric conversion layer 30 and a conduction band (CB) level of the buffer layer 40 may be higher than a LUMO level of the photoelectric conversion layer 30. For example, the valence band (VB) level of the buffer layer 40 and the HOMO level of the photoelectric conversion layer 30 may have a difference of greater than about 0 eV and less than or equal to about 0.5 eV, and the conduction band (CB) level of the buffer layer 40 and the LUMO level of the photoelectric conversion layer 30 may have a difference of greater than or equal to about 1.1 eV and less than or equal to about 4 eV. Accordingly, the electron blocking layer (EBL) may not limit (and/or block) transfer of holes from the photoelectric conversion layer 30 to the anode 10, but effectively limit (and/or block) transfer of electrons from the photoelectric conversion layer 30 to the anode 10.

The x, y, and z may be confirmed by a composition ratio analysis method such as an XPS (X-ray photoelectron spectroscopy), AES (Auger electron spectroscopy), RBS (Rutherford backscattering spectrometry), and the like, without limitation.

The buffer layer 40 may include a first electron blocking layer including a silicon nitride ($SiN_x$, $0<x<1$) and a second electron blocking layer including silicon oxynitride ($SiO_yN_z$, $0<y<0.5$, $0<z<1$), P-doped silicon oxynitride ($SiO_yN_z$:P, $0<y<0.5$, $0<z<1$) or a combination thereof. In addition, the first electron blocking layer and the second electron blocking layer may be alternately present to provide a multi-layered buffer layer.

The buffer layer 40 may have a thickness of about 1 nm to about 30 nm, for example about 3 nm to about 15 nm. Within the thickness ranges, a dark current of an optoelectronic device may be improved while not deteriorating photoelectric conversion efficiency.

The buffer layer 40 may be a first buffer layer, and the optoelectronic device 100 may further include a second buffer layer between the cathode 20 and the photoelectric conversion layer 30. The second buffer layer may be a hole blocking layer.

For example, FIG. 1B illustrates an optoelectronic device 101 according to some example embodiments that includes a second buffer layer 40' between the cathode 20 and the photoelectric conversion layer 30. The second buffer layer 40' may include an inorganic oxide including one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof.

The optoelectronic device 100 may further include a third buffer layer between the anode 10 and the photoelectric conversion layer 30. The third buffer layer may include one of a hole injection layer (HIL) promoting injection of holes separated from the photoelectric conversion layer 30, a hole transport layer (HTL) promoting transportation of the holes, and a combination thereof.

The optoelectronic device 100 may further include a fourth buffer layer between the cathode 20 and the photoelectric conversion layer 30 wherein the fourth buffer layer may include one an electron injection layer (EIL) promoting injection of electrons, an electron transporting layer (ETL) promoting transportation of the electrons, and a combination thereof.

FIG. 1C illustrates an optoelectronic device 102 according to some example embodiments that is the same as the optoelectronic device 101 in FIG. 1B, except the optoelectronic device further include the third buffer layer 41 and the fourth buffer layer 41'. At least one of the second buffer layer 40', third buffer layer 41, and fourth buffer layer 41' may be omitted.

The hole transport layer (HTL) may include one of poly(3,4-ethylenedioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), tungsten oxide ($WO_x$, $0<x \leq 3$), molybdenum oxide ($MO_x$, $1<x<3$), vanadium oxide ($V_2O_5$), rhenium oxide, nickel oxide ($NiO_x$, $1<x<4$), copper oxide, titanium oxide, molybdenum sulfide, and a combination thereof, but is not limited thereto.

The electron transport layer (ETL) may include one of 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, aluminum (Al), an aluminum oxide, magnesium (Mg), a magnesium oxide, molybdenum (Mo), a molybdenum oxide and a combination thereof, but is not limited thereto.

The buffer layer 40 may have surface roughness ranging from about 0.2 nm to about 20 nm. Within the range, junction characteristics and light transmittance characteristics between the buffer layer 40 and the photoelectric conversion layer 30 may be improved.

Silicon nitride having a stoichiometric ratio within the range may be formed by depositing a silicon source material and a nitrogen source material under an atmosphere including one of an inactive atmosphere, a reduction atmosphere, or a combination thereof, while their supply amounts are controlled. The silicon source material may be a silane compound, and its specific examples may include silane (SiH$_4$), disilane, and a derivative thereof. The nitrogen source material may be N$_2$, NH$_3$, and the like. The inactive atmosphere may be an inert gas atmosphere including nitrogen, argon, and the like, and the reduction atmosphere is a hydrogen atmosphere or a mixture atmosphere of the hydrogen and the inert gas. The deposition may be performed in a chemical vapor deposition (CVD) method, for example, a plasma enhanced chemical vapor deposition (PECVD) method. The deposition (e.g., CVD or PECVD) is performed without a particularly limited condition.

Silicon oxynitride having a stoichiometric ratio within the ranges may be formed by depositing a silicon source material and an oxygen-containing nitrogen source material under an inactive atmosphere, a reduction atmosphere, or a combination thereof, while their supply amounts are controlled; by depositing a silicon source material, a nitrogen source material, and an oxygen-containing nitrogen source material under an inactive atmosphere, a reduction atmosphere, or a combination thereof, while their supply amounts are controlled; or by depositing a silicon source material and a nitrogen source material under an oxygen atmosphere or an oxygen-containing atmosphere, while their supply amounts are controlled. The silicon source material may be a silane compound, and its specific examples may be silane (SiH$_4$), disilane, a derivative thereof, and a combination thereof. In addition, the oxygen-containing nitrogen source material may be nitrous oxide (N$_2$O), nitrogen monoxide (NO), dinitrogen pentoxide (N$_2$O$_5$), dinitrogen tetroxide (N$_2$O$_4$), or a combination thereof. The nitrogen source material may be N$_2$, NH$_3$, and the like. The inactive atmosphere may be an inert gas atmosphere including nitrogen, argon, and the like, and the reduction atmosphere may be a hydrogen atmosphere or a mixture atmosphere of the hydrogen and the inert gas. The deposition may be performed in a chemical vapor deposition method (CVD), for example, in a plasma enhanced chemical vapor deposition method (PECVD). The deposition (e.g., CVD or PECVD) is not performed under a particularly limited condition.

When the silicon nitride or silicon oxynitride is further doped with phosphorus, a phosphorus-containing material may be supplied with the source materials. The phosphorus-containing material may include phosphine (PH$_3$), alkyl phosphine, aryl phosphine, a phosphine oxide, an organic phosphate, and the like. The alkyl phosphine may include trimethyl phosphine, triethyl phosphine, and the like, the aryl phosphine may include triphenylphosphine, and the like, phosphine oxide may include trimethylphosphine oxide, triethylphosphine oxide, and the like, and the organic phosphate may include trimethyl phosphate, triethyl phosphate, and the like.

The optoelectronic device 100 may be a light-receiving device or a light emitting device, and examples thereof may be a photodiode, a light emitting diode, a solar cell, and may be also applied to an image sensor, a photosensor, a photodetector, without limitation. The optoelectronic device may be an organic optoelectronic device, for example an organic photodiode, an organic light emitting diode (OLED), an organic solar cell, and may be applied to an organic image sensor, an organic photosensor, an organic photodetector, an organic solar cell, and the like.

Hereinafter, an example of an image sensor including the optoelectronic device is described referring to drawings. As an example of an image sensor, an organic CMOS image sensor is described.

Figure 3:
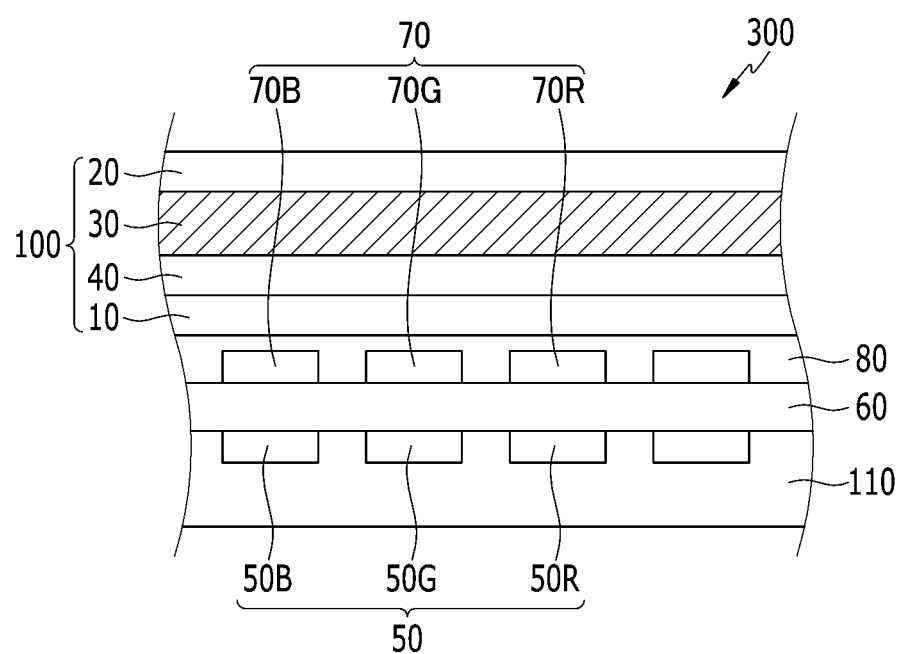
FIG. 3 is a cross-sectional view showing an organic CMOS image sensor according to some example embodiments.

FIG. 3 is a cross-sectional view showing an organic CMOS image sensor according to some example embodiments.

FIG. 3 shows a blue pixel, a green pixel, and a red pixel that are adjacent to each other, but this is not limiting. Hereinafter, a constituent element including "B" in the reference numeral refers to a constituent element included in the blue pixel, a constituent element including "G" in the reference numeral refers to a constituent element included in the green pixel, and a constituent element including "R" in the reference numeral refers to a constituent element included in the red pixel.

Referring to FIG. 3, a CMOS image sensor 300 according to some example embodiments includes a semiconductor substrate 110 integrated with a photo-sensing device 50, and a transmission transistor (not shown), a lower insulation layer 60, color filters 70B, 70G, and 70R, an upper insulation layer 80, and an optoelectronic device 100.

The semiconductor substrate 110 may be a silicon substrate, and is integrated with the photo-sensing device 50 and transmission transistor (not shown). The photo-sensing device 50 may be a photodiode. The photo-sensing device 50 and the transmission transistor (not shown) may be integrated in each pixel, and as shown in the drawing, the photo-sensing device 50 may include a photo-sensing device 50B of a blue pixel, a photo-sensing device 50G of a green pixel, and a photo-sensing device 50R of a red pixel. The photo-sensing device 50 senses light, and the information sensed by the photo-sensing device 50 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench (not shown) exposing the photo-sensing devices 50B, 50G, and 50R. The trench may be filled with fillers.

A color filter layer 70 is formed on the lower insulation layer 60. The color filter layer 70 includes a blue filter 70B formed in the blue pixel, a green filter 70G formed in the green pixel, and a red filter 70R formed in the red pixel. The upper insulation layer 80 is formed on the color filter layer 70. The upper insulation layer 80 eliminates a step caused by the color filter layer 70 and smoothens the surface. The optoelectronic device 100 is formed on upper insulation layer 80.

As described above, the optoelectronic device 100 includes an anode 10 and a cathode 20 facing each other, a photoelectric conversion layer 30 between the anode 10 and the cathode 20, and a buffer layer 40 between the anode 10 and the photoelectric conversion layer 30. The drawing shows an example in which the anode 10 is disposed on the upper insulation layer 80, but the cathode 20 may be positioned on the upper insulation layer 80.

At least one of the anode 10 and the cathode 20 may be, for example, a light transmitting electrode, and the photoelectric conversion layer 30 may include an organic material absorbing light of a visible ray region.

The light incident from the anode 10 or the cathode 20 may be photoelectrically converted at the photoelectric conversion layer 30, may be passed through the cathode 20 or the anode 10, and may be sensed by a photo-sensing device 50.

A CMOS image sensor 300 according to the embodiment includes the optoelectronic device 100, and thus may increase electron blocking properties between the anode 10 and the photoelectric conversion layer 30 and secure photoelectric conversion efficiency (EQE), and simultaneously decrease a dark current and resultantly have reduced noise and improved performance.

Figure 4:
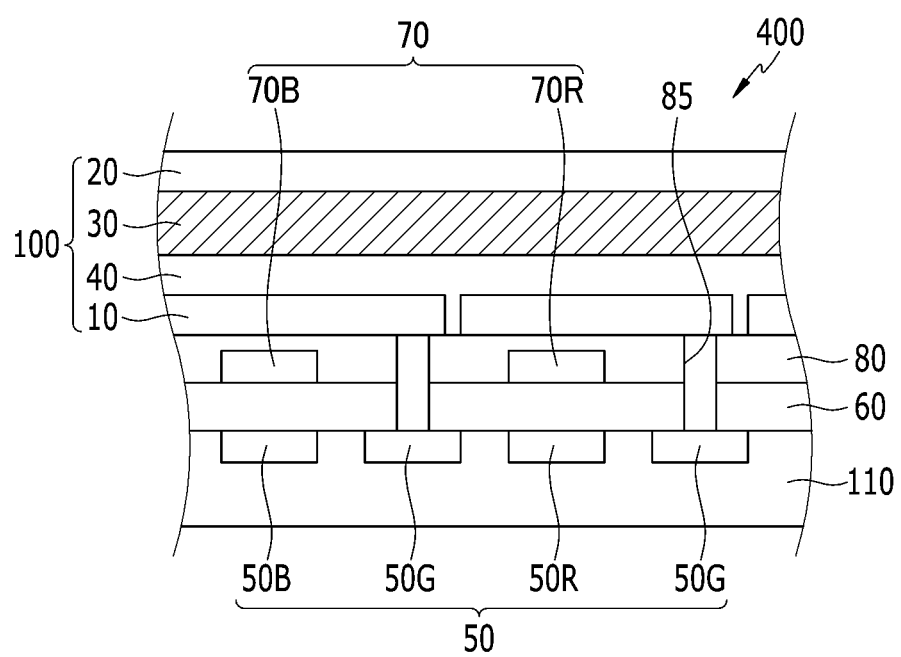
FIG. 4 is a cross-sectional view showing an organic CMOS image sensor according to some example embodiments.

FIG. 4 is a cross-sectional view showing an organic CMOS image sensor according to some example embodiments.

The organic CMOS image sensor 400 includes a semiconductor substrate 110 integrated with a photo-sensing device 50, and a transmission transistor (not shown), a lower insulation layer 60, a color filter layer 70, an upper insulation layer 80, and an optoelectronic device 100, as above.

However, the organic CMOS image sensor 400 may omit the green filter 70G and instead may substitute the photoelectric conversion layer 30 of the optoelectronic device 100 for the green filter 70G. The photoelectric conversion layer 30 of the optoelectronic device 100 may include, for example, an organic material mainly absorbing light in a green wavelength region, and the light incident from the cathode 20 may be photoelectrically converted by the organic material mainly absorbing light in the green wavelength region in the photoelectric conversion layer 30, while light in the other wavelength regions is passed through the anode 10 and sensed by a photo-sensing device 50. The upper insulation layer 80 and lower insulation layer 60 have through-holes 85 to expose a photo-sensing device 50G of a green pixel.

However, when the photoelectric conversion layer 30 of the optoelectronic device 100 includes an organic material that mainly absorbs light of a red wavelength region or an organic material that mainly absorbs light of a blue wavelength region, a red filter 70R or a blue filter 70B may be substituted with the photoelectric conversion layer 30.

The image sensor may include a semiconductor substrate integrated with a plurality of first photo-sensing devices sensing light in a blue wavelength region, a plurality of second photo-sensing devices sensing light in a red wavelength region, and a third photo-sensing device positioned on the semiconductor substrate and selectively absorbing light in a green wavelength region, wherein at least one of the first photo-sensing device, the second photo-sensing device, and the third photo-sensing device may include the optoelectronic device.

The image sensor may further include a color filter layer including a blue filter selectively absorbing light in a blue wavelength region and a red filter selectively absorbing light in a red wavelength region, between the semiconductor substrate and the third photo-sensing device.

Figure 5:
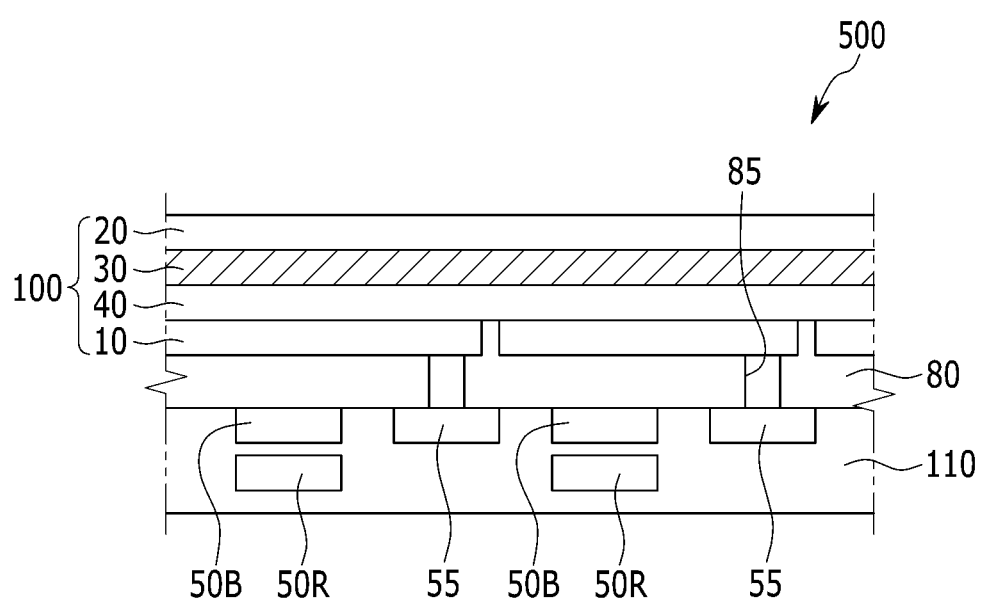
FIG. 5 is a schematic cross-sectional view showing an organic CMOS image sensor according to some example embodiments.

The first photo-sensing device and the second photo-sensing device may be stacked in a vertical direction in the semiconductor substrate. Such a structure is shown in FIG. 5. The CMOS image sensor 500 of FIG. 5 may include a semiconductor substrate 110 integrated with the first photo-sensing device 50B and the second photo-sensing device 50R, a charge storage device 55, and a transmission transistor (not shown), an upper insulation layer 80, and an optoelectronic device 100.

Even though FIGS. 3 to 5 are non-limiting example including the optoelectronic device 100 of FIG. 1A, any one of the optoelectronic devices 101 and 102 in FIGS. 1B and 1C may be substituted for the optoelectronic device 100 in FIGS. 3 to 5.

Figure 6:
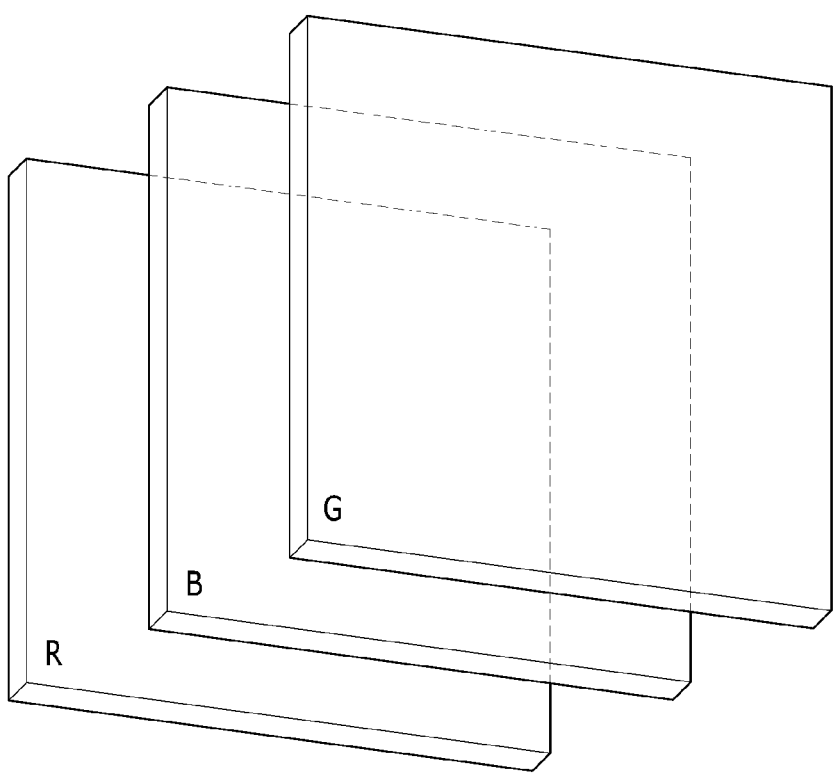
FIG. 6 is a schematic view showing an organic CMOS image sensor according to some example embodiments.
Figure 7:
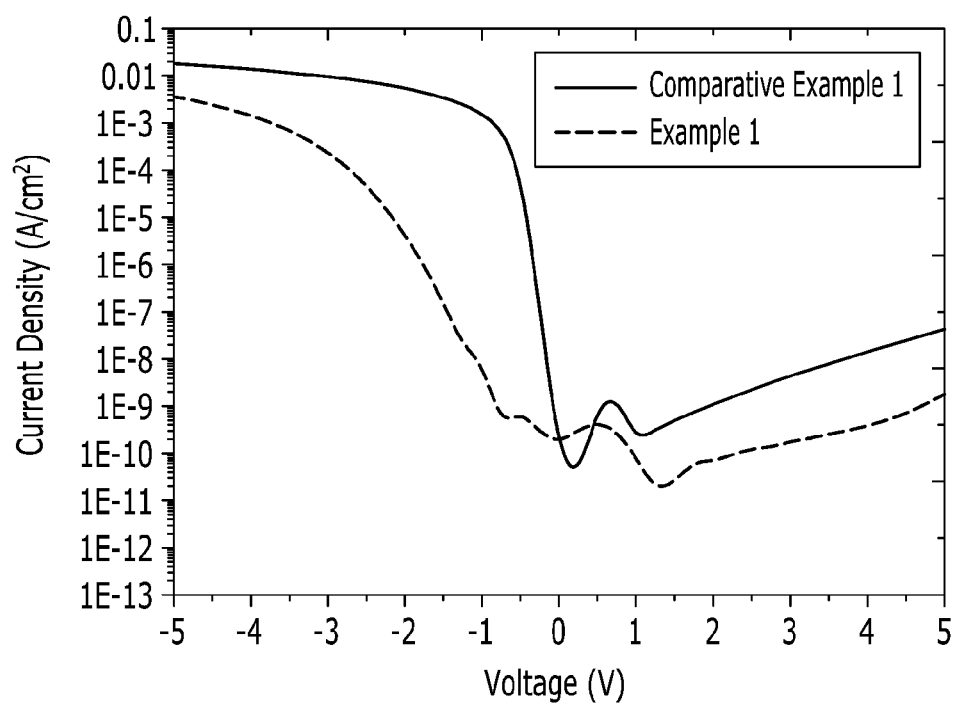
FIG. 7 is a graph showing current density of the optoelectronic devices according to Comparative Example 1 and Example 1 depending on a voltage.
Figure 8:
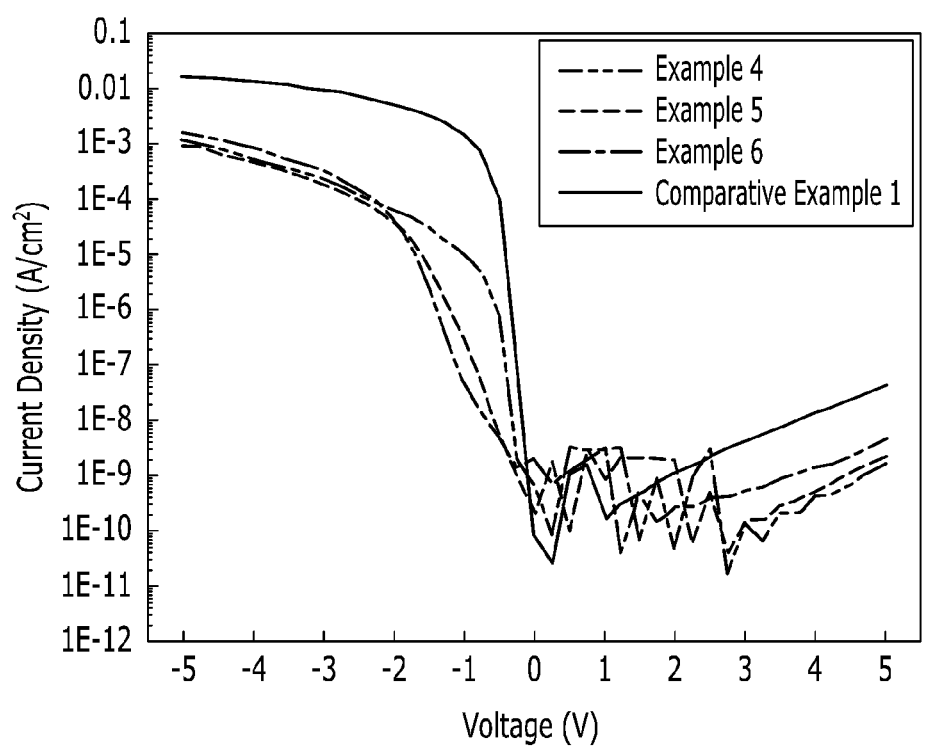
FIG. 8 is a graph showing current density of the optoelectronic devices according to Comparative Example 1 and Examples 4 to 6 depending on a voltage.
Figure 9:
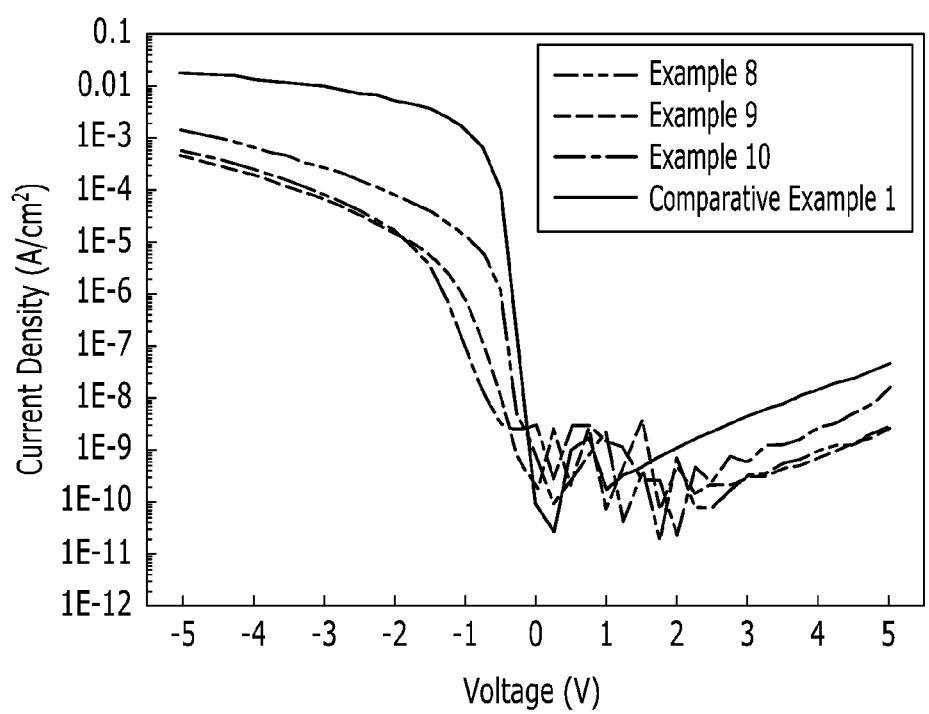
FIG. 9 is a graph showing current density of the optoelectronic devices according to Comparative Example 1 and Examples 8 to 10 depending on a voltage.

Referring to FIG. 6, the image sensor may include a green photoelectric device (G) selectively absorbing light in a green wavelength region, a blue photoelectric device (B) selectively absorbing light in a blue wavelength region, and a red photoelectric device (R) selectively absorbing light in a red wavelength region which are stacked, wherein at least one of the green photoelectric device, the blue photoelectric device and the red photoelectric device may be the optoelectronic device.

According to some example embodiments, an electronic device including the image sensor is provided.

The electronic device may be, for example, a mobile phone, a digital camera, a biosensor, and the like, but is not limited thereto.

Hereinafter, the present disclosure is illustrated in more detail with reference to examples. However, these examples are non-limiting, and the present disclosure is not limited thereto.

Manufacture of Optoelectronic Device

Comparative Example 1

A 150 nm-thick anode is formed on a glass substrate by sputtering indium tin oxide (ITO). On the anode, 210 nm-thick photoelectric conversion layer is formed by codepositing a compound represented by Chemical Formula 1-1 (2-((5-(naphthalen-1-yl(phenyl)amino)selenophen-2-yl) methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device.

[Chemical Formula 1-1]

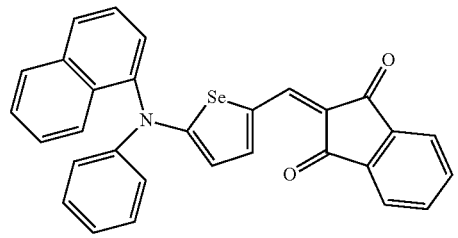

Examples 1 to 3 and Comparative Examples 2 to 4

A 150 nm-thick anode is formed on a glass substrate by sputtering indium tin oxide (ITO). On the anode, a 10 nm-thick silicon nitride ($SiN_x$) buffer layer is formed in a chemical vapor deposition (CVD) method, while silane ($SiH_4$) and $N_2$ are supplied under an argon atmosphere. On the silicon nitride ($SiN_x$) buffer layer, a 210 nm-thick photoelectric conversion layer is formed by codepositing a compound represented by Chemical Formula 1-1 (2-((5-(naphthalen-1-yl(phenyl)amino)selenophen-2-yl)methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device. In Examples 1 to 3 and Comparative Examples 2 to 4, the x value of the silicon nitride (SiNx) may be adjusted as later shown in Table 1.

Examples 4 to 6

A 150 nm-thick anode is formed by sputtering indium tin oxide (ITO) on a glass substrate. On the anode, each of 3 nm-thick, 5 nm-thick, and 10 nm-thick silicon oxynitride ($SiO_yN_z$, y=0.33, z=0.45) buffer layer is formed in a chemical vapor deposition (CVD) method while silane ($SiH_4$), nitrous oxide ($N_2O$), and $NH_3$ are supplied under an argon atmosphere. On the silicon oxynitride ($SiO_yN_z$, y=0.33, z=0.45) buffer layer, a 210 nm-thick photoelectric conversion layer is formed by codepositing compound represented by Chemical Formula 1-1 (2-((5-(naphthalen-1-yl(phenyl)amino)selenophen-2-yl)methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device.

Example 7

An optoelectronic device is manufactured according to the same method as Example 4, except that a 10 nm-thick silicon oxynitride ($SiO_yN_z$, y=0.34, z=0.67) buffer layer is formed.

Examples 8 to 10

A 150 nm-thick anode is formed by sputtering indium tin oxide (ITO) on a glass substrate. On the anode, each of 3 nm-thick, 5 nm-thick, and 10 nm-thick P-doped silicon oxynitride ($SiO_yN_z$:P, y=0.33, z=0.45) buffer layer is formed in a chemical vapor deposition (CVD) method while silane ($SiH_4$), nitrous oxide ($N_2O$), $NH_3$, and $PH_3$ are supplied under an argon atmosphere. On the P-doped silicon oxynitride ($SiO_yN_z$:P, y=0.33, z=0.45) buffer layer, a 210 nm-thick photoelectric conversion layer is formed by codepositing compound represented by Chemical Formula 1-1 (2-((5-(naphthalen-1-yl(phenyl)amino)selenophen-2-yl)methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device.

Energy Band Level and Energy Bandgap of Buffer Layer Depending on Stoichiometric Ratio The silicon nitride ($SiN_x$) stoichiometric ratios of the buffer layers of Examples 1 to 3 and Comparative Examples 2 to 4 are measured by using a XPS (X-ray photoelectron spectroscopy) and shown in Table 1. In addition, valence and conduction band levels of the buffer layers including silicon nitride ($SiN_x$) are shown in Table 1.

TABLE 1

|  | Comp. Ex. 2 | Ex. 1 | Ex. 2 | Ex. 3 | Comp. Ex. 3 | Comp. Ex. 4 |
|---|---|---|---|---|---|---|
| x value of $SiN_x$ | 0 | 0.45 | 0.67 | 0.92 | 1.21 | 1.44 |
| Valence band level (eV) | −4.78 | −4.79 | −4.8 | −4.813 | −5.517 | −6.02 |
| Conduction band level (eV) | −3.66 | −2.69 | −2.3 | −1.573 | −1.427 | −1.04 |
| Energy bandgap (eV) | −1.12 | −2.1 | −2.5 | −3.24 | −4.09 | −4.98 |

The silicon oxynitride ($SiO_yN_z$) stoichiometric ratios of the buffer layers according to Examples 4 and 7 are measured through XPS (X-ray photoelectron spectroscopy) and shown in Table 2. In addition, the valence and conduction band levels of the buffer layer including silicon oxynitride ($SiO_yN_z$) are measured and shown in Table 2. The valence and conduction band levels of the buffer layer according to Comparative Example 2 are also shown in Table 2 for comparison.

TABLE 2

|  | Comparative Example 2 | Example 4 | Example 7 |
|---|---|---|---|
| y and z values of $SiO_yN_z$ | y = 0, z = 0 | y = 0.33, z = 0.45 | y = 0.34, z = 0.67 |
| Valence band level (eV) | −4.78 | −5.1 | −5.65 |
| Conduction band level (eV) | −3.66 | −1.99 | −2 |
| Energy bandgap (eV) | −1.12 | −3.11 | −3.65 |

The P-doped silicon oxynitride ($SiO_yN_z$:P) stoichiometric ratio of the buffer layer according to Example 8 are measured through XPS (X-ray photoelectron spectroscopy) and shown in Table 3. In addition, the valence and conduction band levels of the buffer layer including P-doped silicon oxynitride ($SiO_yN_z$:P) are measured and shown in Table 3.

TABLE 3

|  | Example 8 |
|---|---|
| y and z values of $SiO_yN_z$ | y = 0.33, z = 0.45 |
| Doping amount of P (at %) | 0.86 |
| Valence band level (eV) | −5.1 |
| Conduction band level (eV) | −1.99 |
| Energy bandgap (eV) | −3.11 |

Referring to Tables 1 to 3, when valence and conduction band levels and a bandgap are changed depending on stoichiometric ratios of silicon nitride ($SiN_x$), silicon oxynitride ($SiO_yN_z$), and P-doped silicon oxynitride ($SiO_yN_z$:P), x is in a range of 0<x<1, and y and z are in a range of 0<y<0.5 and 0<z<1, an energy bandgap turns out to be in a range of about 1.5 eV to about 3.8 eV.

Dark Current of Optoelectronic Device

Current densities of the optoelectronic devices according to Examples 1 to 10 and Comparative Examples 1 to 4 depending on a voltage are measured to evaluate a dark current. The current densities of the optoelectronic devices according to Comparative Example 1 and Example 1 depending on a voltage are measured and shown in FIG. 7, the current densities of the optoelectronic devices according to Examples 4 to 6 depending on a voltage are measured and shown in FIG. 8, and the current densities of the optoelectronic devices according to Examples 8 to 10 depending on a voltage are measured and shown in FIG. 9. Referring to FIGS. 7 to 10, the current densities at −3 V of the optoelectronic devices according to Examples are reduced compared with the current densities of the optoelectronic devices according to Comparative Example 1 at −3 V. From the results, dark currents at −3 V of the optoelectronic devices according to Examples are reduced. For example, the optoelectronic device according to Example 1 shows remarkably reduced dark current of 11 e/s at −3 V compared with 20 e/s of the optoelectronic device according to Comparative Example 1 at −3 V.

External Quantum Efficiency of Optoelectronic Device

Each external quantum efficiency of the optoelectronic devices according to Examples 1 to 10 and Comparative Examples 1 to 4 depending on a wavelength is measured. The external quantum efficiency at −3 V of the optoelectronic devices according to Example 1, Examples 4 to 6 and Examples 8 to 10 is shown in Table 4.

TABLE 4

|  | External quantum efficiency (%, −3 V) |
| --- | --- |
| Example 1 | 67 |
| Example 4 | 61.9 |
| Example 5 | 52.1 |
| Example 6 | 49.9 |
| Example 8 | 62.2 |
| Example 9 | 55.3 |
| Example 10 | 51.3 |

Table 4 shows that the external quantum efficiency at −3 V of the optoelectronic devices according to Example 1, Examples 4 to 6 and Examples 8 to 10 are improved.

Thermal Stability of Optoelectronic Device

The optoelectronic devices according to Examples 1 to 10 and Comparative Examples 1 to 4 are respectively put on a hot plate, and their dark currents are changed, while a temperature is changed. The dark currents of the optoelectronic devices according to Comparative Example 1 and Example 1 depending on a temperature are measured. The results are shown in Table 5.

TABLE 5

| Temperature | Example 1 | Comparative Example 1 |
| --- | --- | --- |
| 150° C. | 0.005 e/s | 0.008 e/s |
| 160° C. | 2 e/s | 15 e/s |
| 170° C. | 0.009 e/s | 165 e/s |
| 180° C. | 3.8 e/s | 20,000 e/s |

Referring to Table 5, the optoelectronic device of Comparative Example 1 shows a dark current as high as 20000 e/s at 180° C., and the optoelectronic device of Example 1 shows a satisfactory dark current of about 3.8 e/s at 180° C.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An optoelectronic device, comprising
   a first electrode and a second electrode facing each other;
   a photoelectric conversion layer between the first electrode and the second electrode; and
   a buffer layer between the photoelectric conversion layer and the second electrode,
   the buffer layer including a nitride,
   the nitride including one of silicon nitride ($SiN_x$, $0.2 \leq x < 1$), silicon oxynitride ($SiO_yN_z$, $0.05 \leq y < 0.5$, $0.2 \leq z < 1$), and a combination thereof.

2. The optoelectronic device of claim 1, wherein the nitride further includes phosphorus.

3. The optoelectronic device of claim 1, wherein the phosphorus is included in an amount of less than or equal to about 10 at % based on 100 at % of the nitride.

4. The optoelectronic device of claim 1, wherein
   the buffer layer is an electron blocking layer, and
   the buffer layer contacts the second electrode.

5. The optoelectronic device of claim 1, wherein
   x is in a range of $0.2 \leq x \leq 0.7$,
   y is in a range of $0.05 \leq y \leq 0.35$ and
   z is in a range of $0.2 \leq z \leq 0.7$).

6. The optoelectronic device of claim 1, wherein an energy band gap of the buffer layer is about −3.8 eV to about −1.5 eV.

7. The optoelectronic device of claim 1, wherein
   the second electrode includes a metal oxide,
   the nitride includes the silicon nitride, and
   the silicon nitride has a valence band level of about −5.0 eV to about −4.5 eV and a conduction band level of about −3.5 eV to about −2.0 eV.

8. The optoelectronic device of claim 1, wherein
   the second electrode includes a metal oxide,
   the nitride include the silicon oxynitride,
   the silicon oxynitride has a valence band level of about −5.8 eV to about −4.5 eV and a conduction band level of about −3.5 eV to about −1.5 eV.

9. The optoelectronic device of claim 1, wherein
   a valence band (VB) level of the buffer layer is higher than a HOMO level of the photoelectric conversion layer, and a
   conduction band (CB) level of the buffer layer is higher than a LUMO level of the photoelectric conversion layer.

10. The optoelectronic device of claim 9, wherein
    a difference between the valence band (VB) level of the buffer layer and the HOMO level of the photoelectric conversion layer is greater than about 0 eV and less than or equal to about 0.5 eV, and
    a difference between the conduction band (CB) of the buffer layer and the LUMO level of the photoelectric conversion layer is greater than or equal to about 1.1 eV and less than or equal to about 4 eV.

11. The optoelectronic device of claim 1, wherein the buffer layer has a thickness of about 1 nm to about 30 nm.

12. The optoelectronic device of claim 1, further comprising:
    a second buffer layer between the first electrode and the photoelectric conversion layer, wherein
    the buffer layer between the photoelectric conversion layer and the second electrode is a first buffer layer.

13. The optoelectronic device of claim 12, wherein the second buffer layer is a hole blocking layer.

14. The optoelectronic device of claim 12, wherein
the second buffer layer includes an inorganic oxide,
the inorganic oxide of the second buffer layer includes one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof.

15. The optoelectronic device of claim 1, wherein the first electrode and the second electrode each independently include one of a metal, a metal oxide, and a combination thereof.

16. The optoelectronic device of claim 1, wherein
the buffer layer includes a first electron blocking layer including silicon nitride ($SiN_x$, $0.2 \leq x < 1$), and the buffer layer includes a second electron blocking layer including one of silicon oxynitride ($SiO_yN_z$, $0.05 \leq y < 0.5$, $0.25 \leq z < 1$), P-doped silicon oxynitride ($SiO_yN_z$:P, $0.05 \leq y < 0.5$, $0.25 \leq z < 1$), and a combination thereof.

17. The optoelectronic device of claim 1, wherein the optoelectronic device is one of a light-emitting device, a photodetector, a memory device, and a solar cell.

18. An image sensor comprising:
the optoelectronic device of claim 1; and
a substrate integrated with the optoelectronic device.

19. The image sensor of claim 18, further comprising:
a plurality of first photo-sensing devices and a plurality of second photo-sensing devices integrated with the substrate, wherein
the substrate is a semiconductor substrate,
the plurality of first photo-sensing devices are configured to sense light in a blue wavelength region,
the plurality of second photo-sensing devices are configured to sense light in a red wavelength region,
the optoelectronic device is an organic optoelectronic device on the semiconductor substrate, and
the optoelectronic device is configured to selectively absorb light in a green wavelength region.

20. The image sensor of claim 19, further comprising:
a color filter layer on the semiconductor substrate, wherein
the color filter layer includes a blue filter configured to selectively absorb light in the blue wavelength region and a red filter configured to selectively absorb light in the red wavelength region.

21. The image sensor of claim 19, wherein the plurality of first photo-sensing devices and the plurality of second photo-sensing devices are stacked in a vertical direction in the semiconductor substrate.

22. The image sensor of claim 18, further comprising:
a green photoelectric device, a blue photoelectric device, and a red photoelectric device stacked on each other on the substrate,
wherein the substrate is a semiconductor substrate,
wherein the green photoelectric device is configured to selectively absorb light in a green wavelength region,
the blue photoelectric device is configured to selectively absorb light in a blue wavelength region, and the red photoelectric device is configured to selectively absorb light in a red wavelength region, and
wherein at least one of the green photoelectric device, the blue photoelectric device and the red photoelectric device is the optoelectronic device.

23. An electronic device comprising:
the image sensor of claim 18, wherein
the substrate is a semiconductor substrate.

24. An optoelectronic device, comprising
a first electrode;
a second electrode on the first electrode, at least one of the first and second electrodes being a light-transmitting electrode;
a photoelectric conversion layer between the first electrode and the second electrode; and
a buffer layer between the photoelectric conversion layer and one of the first electrode and the second electrode,
the buffer layer including a nitride layer including one of silicon nitride ($SiN_x$, $0.2 \leq x < 1$), silicon oxynitride ($SiO_yN_z$, $0.05 \leq y < 0.5$, $0.2 \leq z < 1$), and a combination thereof.

25. The optoelectronic device of claim 24, further comprising:
a second buffer layer between the first electrode and the photoelectric conversion layer, wherein
the buffer layer between the photoelectric conversion layer and one of the first electrode and the second electrode is a first buffer layer between the photoelectric conversion layer and the second electrode,
the second buffer layer includes an inorganic oxide layer, and
the inorganic oxide layer includes one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_5$ ($1.0 \leq x5 < 2.5$), $WO_{x6}$ ($2.0 < x6 < 3.0$), and a combination thereof.

26. The optoelectronic device of claim 24, further comprising at least one of:
a hole injection layer between the photoelectric conversion layer and a first one of the first electrode and the second electrode; and
an electron injection layer between the photoelectric conversion layer and a second one of the first electrode and the second electrode that is different than the first one of the first electrode and the second electrode.

27. The optoelectronic device of claim 24, wherein
the buffer layer includes a first electron blocking layer including silicon nitride ($SiN_x$, $0.2 \leq x < 1$),
the buffer layer includes a second electron blocking layer including one of silicon oxynitride ($SiO_yN_z$, $0.05 \leq y < 0.5$, $0.2 \leq z < 1$), P-doped silicon oxynitride ($SiO_yN_z$:P, $0.05 \leq y < 0.5$, $0.2 \leq z < 1$), and a combination thereof, and
the nitride layer is the first electron blocking layer.

28. The optoelectronic device of claim 24, wherein the nitride layer further includes phosphorus.

* * * * *